United States Patent
Levy et al.

(10) Patent No.: US 9,236,509 B2
(45) Date of Patent: Jan. 12, 2016

(54) SOLAR CELLS WITH PATTERNED ANTIREFLECTIVE SURFACES

(71) Applicants: David H. Levy, Rochester, NY (US); Daniele Margadonna, Ciampino (IT); Dennis Flood, Oberlin, OH (US); Wendy G. Ahearn, Rochester, NY (US); Richard W. Topel, Jr., Rochester, NY (US); Theodore Zubil, Honeoye Falls, NY (US)

(72) Inventors: David H. Levy, Rochester, NY (US); Daniele Margadonna, Ciampino (IT); Dennis Flood, Oberlin, OH (US); Wendy G. Ahearn, Rochester, NY (US); Richard W. Topel, Jr., Rochester, NY (US); Theodore Zubil, Honeoye Falls, NY (US)

(73) Assignee: Natcore Technology, Inc., Rochester, NY (US)

(*) Notice: Subject to any disclaimer, the term of this patent is extended or adjusted under 35 U.S.C. 154(b) by 0 days.

(21) Appl. No.: 14/260,687

(22) Filed: Apr. 24, 2014

(65) Prior Publication Data
US 2014/0322858 A1    Oct. 30, 2014

Related U.S. Application Data

(60) Provisional application No. 61/815,524, filed on Apr. 24, 2013, provisional application No. 61/815,537, filed on Apr. 24, 2013.

(51) Int. Cl.
*H01L 21/76*  (2006.01)
*H01L 31/0236*  (2006.01)
*H01L 31/068*  (2012.01)
*H01L 31/18*  (2006.01)

(52) U.S. Cl.
CPC ........ *H01L 31/02363* (2013.01); *H01L 31/068* (2013.01); *H01L 31/1804* (2013.01)

(58) Field of Classification Search
CPC ............... H01L 21/31111; H01L 21/6715; H01L 21/743; H01L 31/02167; H01L 31/02168; H01L 31/022425; H01L 31/022441; H01L 31/02245; H01L 31/0236; H01L 31/02363; H01L 31/0284; H01L 31/03572; H01L 31/0512; H01L 31/0516; H01L 31/068; H01L 31/0682; H01L 31/0747
USPC ........... 438/71, 444, 445, 446, 447, 448, 449, 438/665, 725, 942, 948, 949
See application file for complete search history.

(56) References Cited

U.S. PATENT DOCUMENTS

| | | |
|---|---|---|
| 8,075,792 B1 | 12/2011 | Branz et al. |
| 2008/0038467 A1* | 2/2008 | Jagannathan et al. ........ 427/256 |
| 2011/0017997 A1 | 1/2011 | Kamath et al. |
| 2011/0045627 A1* | 2/2011 | Sachs et al. ..................... 438/71 |
| 2011/0214719 A1* | 9/2011 | Li et al. .......................... 136/252 |
| 2011/0306160 A1 | 12/2011 | Parks et al. |
| 2012/0097234 A1 | 4/2012 | Bojarczuk et al. |
| 2013/0089944 A1 | 4/2013 | Rhieu |

* cited by examiner

*Primary Examiner* — Kyoung Lee
*Assistant Examiner* — Joannie A Garcia
(74) *Attorney, Agent, or Firm* — Winstead PC (57) ABSTRACT

Systems and methods for producing nanoscale textured low reflectivity surfaces may be utilized to fabricate solar cells. A substrate may be patterned with a resist prior to an etching process that produces a nanoscale texture on the surface of the substrate. Additionally, the substrate may be subjected to a dopant diffusion process. Prior to dopant diffusion, the substrate may be optionally subjected to liquid phase deposition to deposit a material that allows for patterned doping. The order of the nanoscale texture etching and dopant diffusion may be modified as desired to produce post-nano emitters or pre-nano emitters.

13 Claims, 4 Drawing Sheets

SOLAR CELLS WITH PATTERNED ANTIREFLECTIVE SURFACES

RELATED APPLICATIONS

This application claims the benefit of U.S. Provisional Patent Application No. 61/815,537, filed on Apr. 24, 2013 and U.S. Provisional Patent Application No. 61/815,524, filed on Apr. 24, 2013, which are incorporated herein by reference.

FIELD OF THE INVENTION

This invention relates to a system and method for producing nanoscale low reflectivity surfaces on a substrate. More particularly, to producing nanoscale low reflectivity surfaces for solar cells.

BACKGROUND OF INVENTION

In recent years, there has been a renewed interest in renewable energy including solar energy, and this has resulted in extensive research into methods of fabricating higher efficiency solar cells that convert sun light into electricity by the photovoltaic effect. Research continues to design silicon-based solar cells that can achieve higher conversion efficiencies without an exorbitant increase in production costs.

The performance of solar cells and other optoelectronic devices is directly related to optical losses caused by high reflectivity. Flat silicon surfaces such as those found on an untreated silicon wafer have a high natural reflectivity across the entire range of the solar spectrum that could otherwise be converted to electrical energy by the silicon photovoltaic device. To produce high efficiency solar cells, researchers have sought ways to minimize reflection losses. One common approach has been to provide anti-reflection coatings (ARC) that typically are selected based on interference. For example, quarter wavelength transparent layers of materials such as $SiO_x$, $TiO_x$, ZnO, ITO, or $Si_3N_4$ are used as ARCs on silicon surfaces. All such ARC coatings are resonant structures and perform well only in a limited spectral range and for specific angles of incidence while the solar spectrum spans a wide range of wavelengths and the incident angle varies during the day. The typical results achieved with simple one-layer ARCs have been a reduction of the surface reflection to about 8 to 15 percent. With more difficult two-layer ARC coatings, the reflectivity can be reduced to about 4 percent, but this kind of coating is expensive to apply and is not effective when placed under glass in photovoltaic modules.

The efficient suppression of reflection in a broad spectral range can be achieved by deep surface texturing. In this regard, etching can be used on a smooth or polished silicon surface to produce rough surfaces with bumps and pits having typical sizes of several or even ten micrometers, and these rough surfaces exhibit reduced reflectivity due to its reflection and absorption characteristics. In one example, anisotropic etching of silicon in KOH/IPA mixtures produces densely packed pyramids that appear black. However, such etching has been typically limited to single crystalline silicon with <1,0,0,> surface orientation, and solar cell design is made more complex by the large penetration pyramids. This texturing also has reflectivity that increases rapidly with the angle of light incidence. More recently, it has been determined that a fine surface texturing on the nanometer scale may be utilized to control reflectivity of silicon surfaces. Specifically, a textured surface with features smaller than the wavelength of light is an effective medium for controlling reflectivity, and testing with regard to solar cell applications has shown that a fine texture that is only about 300 to 500 nanometers in depth and provides a gradual grading of the silicon density and of the index of refraction from the surface to the bulk that is adequate to suppress reflectivity of a silicon surface in the usable spectral range of photon energies above the band gap. Such a textured surface may be thought of a sub-wavelength structured surface that behaves itself as an anti-reflective surface, with the gradually tapered density of the anti-reflective surface suppressing reflection over a wide spectral bandwidth and over a large incidence angle of the incoming light. A method of nanoscale texturing of silicon surfaces has been developed that utilizes wet chemical etching to reduce optical losses due to surface reflection to below 5 percent at all solar wavelengths for crystalline silicon.

While a nanoscale textured surface provides low reflection, this uneven and porous surface makes electrical contact to the silicon surface difficult. Additionally, nano scale texturing of the silicon surface that will be under metal contacts in the photovoltaic device is unnecessary since those areas will be shaded by the metal and cannot realize any benefit from reduced reflection. Thus, there is a need for cost effective improved methods to pattern the nanoscale textured surface of a silicon substrate or the like.

SUMMARY OF THE INVENTION

In one embodiment, methods for producing a patterned antireflective surface may comprise applying a resist pattern on a substrate and nanoscale texturization etching the substrate. A barrier layer may be optionally deposited on the substrate prior to subjecting the substrate to dopant diffusion after the nanoscale texturization. In some embodiments, the resulting substrate may provide regions with and without nanoscale texturization. Further, some embodiments may also provide regions with different doping levels.

In another embodiment, methods for producing a patterned antireflective surface may comprise subjecting a substrate to dopant diffusion and optionally cleaning the substrate. Further, a resist pattern may be applied to the substrate prior to nanoscale texturization etching of the substrate. The resulting substrates may provide regions without nanoscale texturization that are suitable for depositing contacts. In some embodiments, the resulting substrate may provide regions with and without nanoscale texturization. Further, some embodiments may also provide regions with different doping levels.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

Systems and methods to produce silicon solar cells with nanoscale textured low reflectivity surfaces and surfaces where the nanoscale texture is substantially absent are discussed herein. The nanoscale textured low reflectivity surfaces may be present, but are preferably absent in regions where an electrical contact is to be provided. Due to its low reflectivity across a broad spectral range, silicon surfaces with a nanoscale texture are sometimes referred to as black silicon. For example, in some embodiments, the textured solar cells discussed herein may provide surfaces having diffuse reflectance that is equal to or below 5% in the range of 400 to 1100 nm wavelengths. In some embodiments, diffuse reflectance of textured solar cells discussed herein is equal to or below 3% in the range of 400 to 1100 nm wavelengths. This nomenclature is applicable even if the resulting surfaces are not perfectly black.

A crystalline silicon photovoltaic (PV) cell has a front side surface operable to receive light and a back side surface opposite the front side surface. The front side surface is doped to form the emitter of the PV cell and has a plurality of electrical contacts formed therein. The back side surface has at least one electrical contact. For solar cells utilizing a nanoscale textured surface, the textured surface and the doped emitter layer may both occupy the front of the cell. In one embodiment, emitter doping of a surface may be performed after nanoscale texturing, referred to herein as post-nano emitter. In another embodiment, emitter doping may be performed before nanoscale texturing, referred to herein as a pre-nano emitter.

Figure 1A:
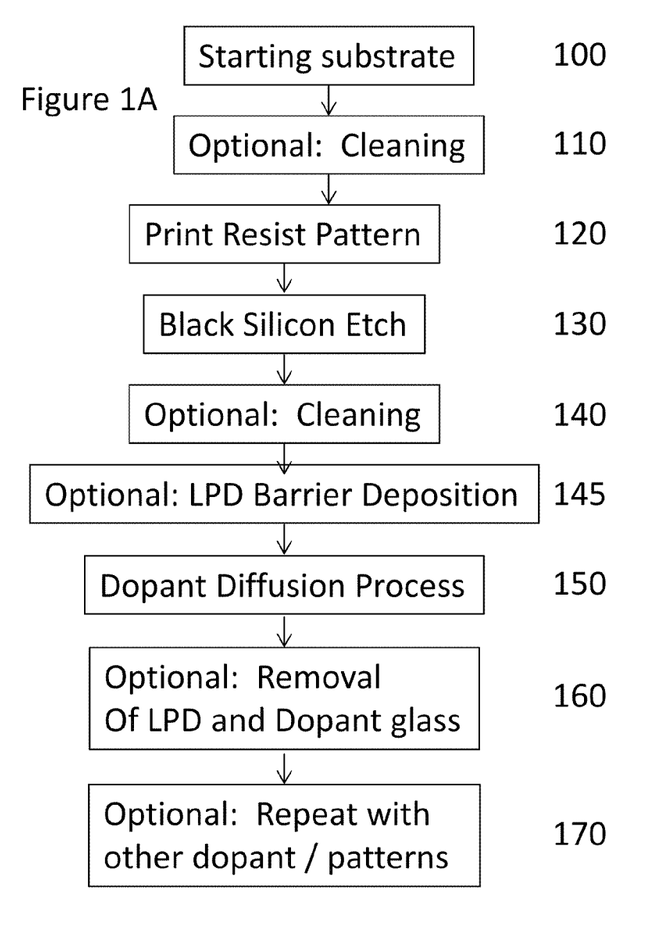
FIG. 1A is an illustrative embodiment of a flow diagram for fabricating a post-nano emitter cell.

FIG. 1A is an illustrative embodiment of a flow diagram for fabricating a post-nano emitter cell. A suitable substrate (step 100) is introduced into the process. The suitable substrate may be a semiconductor wafer of any convenient size or shape. Nonlimiting examples of suitable semiconductors includes group IV semiconductors such as silicon or germanium, group III-V semiconductors such as gallium arsenide or indium phosphide, and group II-VI semiconductors such as cadmium telluride. In some embodiments, the substrate thickness is preferably equal to or below about 1 mm. The surface of the semiconductor wafer may be polished. In some embodiments for solar cell applications, it may be preferable for the starting wafer to have a surface that is textured to promote light absorption. The surface texture may be applied by mechanical means, laser processes, chemical etching processes, or the like. In some embodiments for silicon wafers, the preferred surface texture may contain exposure of predominantly <111> and <110> facets, such as is obtained by treatment with basic solutions containing KOH or NaOH in conjunction with surfactants such as alcohols. In some embodiments, the surface may be chemically smoothed by treatment with various etchants. A starting wafer that has a rough texture resulting from the wafer sawing process can be chemically smoothed with hydroxide containing etchants, such as NaOH, KOH, TMAH (tetramethylammonium hydroxide), combinations thereof, or the like. The concentrations of these etchants can be greater than 10%, and etching may be performed at temperatures equal to or greater than 50° C. The resulting surface is substantially smoothed relative to the starting rough surface, but may still contains pits, depressions, or surface undulations.

The starting substrate may be highly pure and thus nearly intrinsic in doping character or may have a particular bulk doping leading it to be n-type or p-type. The presence of doping modifies the bulk resistivity of the substrate. In some embodiments, substrates have a bulk resistivity equal to or between about 0.1 to 50 ohm-cm. In some embodiments, substrates have a bulk resistivity equal to or between about 1 to 5 ohm-cm. In some embodiments, the substrate may have patterned doping regions. In some embodiments, the substrate may have various films on its surface such as dielectric or metal films. From the foregoing description, it is clear that the method is applicable to various substrates. Further, it will be recognized that a suitable substrate is in no way limited to the particular embodiments discussed.

The substrate is optionally cleaned (step 110). Cleaning of the substrate may be done by solution means, including, but not limited to, treatments with acids, bases, and oxidizing chemistries. Suitable cleaning solutions include the so called RCA process, involving exposure to at least (1) a solution including HCl and $H_2O_2$; (2) a solution including $NH_4OH$ and $H_2O_2$; and (3) a solution including HF. The exposure to cleaning solutions can include exposure to any combination of them in any suitable order. Cleaning can also include other solution exposures, such as the Piranha etch, comprising $H_2SO_4$ and $H_2O_2$, or solvent exposures, or cleaning in water. Useful solvents include alcohols, ketones, hydrocarbons, or halogenated solvents. Cleaning can also involve dry processes. These include ozone exposures, corona discharge treatments, plasma treatments, or the like. The treatments may be intended to clean the surface; however, it may be useful to combine cleaning with treatments that etch the surface.

The resist pattern is next applied to the substrate (step 120). The resist may be a polymeric material that can be formulated for easy printing, preventing the formation of nanoscale texturing, and optionally preventing the deposition of LPD films on its surface, and/or easy removal. The ease of removal requires that the polymer not degrade, crosslink, or harden during exposure to the chemistries of subsequent process steps. The polymer should not be soluble in water since it needs to survive water based processing steps, but for ease of processing and cleaning in manufacture it may be soluble in solvents that are themselves soluble in water. For example, polymers that work well for this method may require solubility in polar solvents (such as alcohols and alkyl acetates), but insolubility in water. Thus, the polymers can be applied by conventional printing methods, but do not dissolve during water based processing steps (such as the LPD deposition itself).

The resist material provides a barrier to etching that allows for patterned etching in one or more desired regions of a substrate. Additionally, in some embodiments, the resist material may also serve to completely or partially prevent the deposition of LPD material in the regions in which it is present. If the resist does not minimize the deposition of a LPD film, then the LPD film could form a barrier that prevents the resist from being easily removed. In the case of complete prevention of deposition, the process is a complete selective deposition. In the case of partial prevention of deposition, the process is partial selective deposition followed by liftoff where the portions of LPD film that forms on top of the resist are removed by dissolution of the resist. In some embodiments, complete selective deposition is desirable so that partial films of LPD that are lifted off do not contaminate the processing system.

Co-polymers comprised principally poly(vinylbutyral), poly(vinylacetate), and poly(vinylalcohol) may provide complete selective deposition and prevent the deposition of LPD films. In some embodiments, the polymers include equal to or greater than about 70% (molar basis) poly(vinylbutyral), equal to or between about 5% and 25% polyvinyl alcohol, with the remainder of poly(vinylacetate). In some embodiments, the polymers include equal to or greater than about 80% (molar basis) poly(vinylbutyral), equal to or between about 10% and 20% polyvinyl alcohol, with the remainder of poly(vinylacetate).

The resist may be printed by any conventional means, including inkjet printing or contact printing methods, such as flexographic printing. In some embodiments, the polymer may be printed using screen printing, as it is compatible with current solar cell processing. Ink formulations require the polymer to be in a solvent that has the correct evaporating and viscosity properties to make a suitable ink for printing. Appropriate solvents for the above polymers may include alcohols, including methanol, ethanol, isopropanol, large molecular weight alcohols, or the like. Appropriate solvents may also include ketones, including branched or straight chain compounds such as acetone or methyl isobutyl ketone, cyclic compounds such as cyclohexane, or the like. In some embodiments, the solvents include compounds that contain an ether or a ketone functionality in addition to an alcohol functionality. Nonlimiting examples of such materials may include butoxyethanol and diacetonealcohol. In some embodiments, the resist formulation may include fillers, surfactant, coating aids or drying aids.

After resist patterning, the substrate receives a nanoscale texture etch (step 130). The nanoscale texture etch can be any etching process that produces a suitable nanoscale structure with a pattern is defined by the resist pattern of step 120. In some embodiments, nanoscale structures comprise nanoscale pores that are equal to or between about 0.05 to 1 micron deep and have pore diameters equal to or below about 250 nm, preferably equal to or below about 100 nm to avoid light scattering. It should be understood that the pore diameters and depth discussed herein represent average values, rather than values of every pore produced. In some embodiments, nanoscale textures can be produced by dry processes, such as plasma etching and laser treatment. In other embodiments, nanoscale texture formation may utilize variants of metal assisted etching. For example, a suitable metal assisted etching process is described in "Metal-Assisted Chemical Etching of Silicon: A Review", Z. Huang et al., Advanced Materials Vol. 23, p. 285 (2011).

As a nonlimiting example, nanoscale etching processes may include the use of a metal catalyst which once deposited on the surface as a nanoparticle promotes localized etching. The metal catalyst can be deposited by vacuum means; for example, a nonlimiting example such as in a vacuum evaporated as described in U.S. Pat. No. 8,143,143. The metal catalyst can also be deposited by solution means. For example, water based solutions that contain a metal precursor and an acidic compound may be utilized. In some embodiments, HF may be utilized as the acid in the deposition of metal for the metal assisted etching, with the HF concentration between or equal to about 0.01 to 1 molar, preferably 0.05 to 0.5 molar. The metal used in the deposition may be any metal that promotes localized etching. Nonlimiting examples of metals that promote localized etching are silver, gold, copper, and platinum. Exemplary metal precursors may include silver nitrate or gold chloride. The concentration of the metal in the catalyst deposition solution can be equal to or between about 10 μM to 10 mM, preferably equal to or between about 0.2 mM to 5 mM. The temperature of the catalyst deposition treatment can be equal to or between about 10° C. to 50° C. The time of the catalyst deposition treatment can be equal to or between about 10 seconds to 5 minutes.

After deposition of the metal catalyst the nanoscale texturing is accomplished by exposing the substrate that any suitable liquid based etching formulation for which etching is enhanced in the vicinity of the metal catalyst nanoparticles. In some embodiments, etching treatment compositions include and acidic compound and an oxidizing compound. Nonlimiting examples of etching treatment compositions may include HF as the acidic component, with concentrations in the range equal to or between about 0.1 to 10 M, preferably 1 to 5 M. Etching treatment compositions may also include $H_2O_2$ as the oxidizing compound, with concentrations in the range equal to or between about 0.1 to 10 M, preferably 1 to 5 M. The temperature of the etching treatment can be equal to or between about 10° C. to 50° C. The time of the etching treatment can be equal to or between about 10 seconds to 5 minutes.

To facilitate manufacture, it may be desired to combine the above catalyst deposition treatment and etching treatments into a single solution, such as described in U.S. Pat. No. 8,075,792. A composition for a single solution nanoscale texturization may include a metal precursor, acidic compound, and an oxidizing compound. A nonlimiting example of a single solution nanoscale texturization may include silver nitrate at a concentration range between or equal to about 10 μM to 1000 μM, HF concentration range between or equal to about 0.1 to 10 M, and $H_2O_2$ concentration range between or equal to about 0.1 to 10 M. The temperature of the single solution nanoscale texturization during the etching step can be 10° C. to 50° C. The time of the single solution nanoscale texturization can be between or equal to about 10 seconds to 5 minutes.

The above nanoscale texturization processes may leave small amounts of metal catalyst on the substrate, as well as the resist. The resist and/or metal catalyst still present upon the substrate may optionally be removed prior to further processing (step 140). Removal can be accomplished by any method that dissolves the metal catalyst. These metal removal processes include exposure to water based solution containing acids such as nitric acid, sulfuric acid, aqua regia, or water based solutions containing bases such as ammonium hydroxide or ammonium hydroxide in combination with oxidizing agents such as $H_2O_2$.

The polymer resist may also be removed as part of cleaning step 140. This removal may occur before or after the metal catalyst removal above. Alternatively, the polymer resist may remain and be used for additional patterning processes as described below. Removal of the resist can occur by rinsing, spraying, or immersion in an appropriate solvent. In some embodiments, the solvent is capable of solubilizing the resist material and is soluble in water to enable compatibility with subsequent processing steps and cleanup. Nonlimiting examples of solvents are alcohols, such as methanol, ethanol, isopropanol or the like. Smaller ketones, such as acetone, may also be utilized. In some embodiments, the removal of the resist may involve mechanical assistance such as sonication, sparging, mixing, or the like. Alternatively, the resist can be removed by dry processes, such as ozone treatment or plasma treatment. Suitable plasmas include an oxygen plasma in vacuum or in the form of an atmospheric air or oxygen plasma jet. In some embodiments, the resist may be removed by a burn off process that subjects the substrate to temperatures of 500° C. or greater. The burn off process may occur in the presence of oxygen and may occur for 1 minute or greater. This burn off process may be performed prior to, during ramp up to doping, or during a doping process.

After the nanoscale texturization but prior to removal of the polymer resist, it may be desirable to deposit additional layers that are also masked by the polymer resist pattern, and thus in automatic alignment with the nanoscale texture pattern.

An LPD deposition (step 145) can be done for the purpose of passivating the black silicon or providing a diffusion barrier to create a selective emitter structure after a dopant diffusion step. The Liquid Phase Deposition (LPD) process provides a simple process for depositing a LPD material on the substrate. The LPD film forms a barrier or mask layer on the substrate that modulates dopant diffusion in subsequent process steps. The LPD film may also or alternatively serve to passivate the substrate. In some embodiments, the LPD film is patterned by the existing polymer resist pattern that was used to pattern the nanoscale texturization. This approach provides LPD barrier or passivation films only in regions over the nanoscale texture.

The LPD process relies upon manipulation of the chemical equilibrium of a solution containing precursors of a desired inorganic material. In some embodiments, the LPD process provides for the deposition of oxides such as but not limited to silicon dioxide, aluminum oxide, and titaniaum dioxide. According to one embodiment, silicon dioxide is at least partially dissolved in the solution; and preferably the solution further comprises $H_2SiF_6$ (fluorosilicic acid). Without wishing to be bound by any particular theory, it is believed that fluorosilicic acid can react with base to produce silicon dioxide, as shown in Equation (1).

$$H_2SiF_6 + 2\ OH^- \rightarrow SiO_2 + 2F^- + 4\ HF \tag{1}$$

The silicon dioxide LPD process requires as one reagent a saturated solution of silicon dioxide in $H_2SiF_6$. This solution is produced by combining a solution of between or equal to about 15 to 40% $H_2SiF_6$ by weight with an excess of silica in the form of a powder or concentrated slurry. The silica is dissolved to saturation at which point any excess silicon if filtered out. In some embodiments, the above saturated solution is combined with water in a ratio of between or equal to about 1 part saturated solution to between or equal to about 0.5 and 10 parts waters. In some embodiments, the above solution is combined with water in a ratio of between or equal to about 1 part saturated solution to between or equal to about 1.5 and 3 parts water. This mixture is maintained at a temperature between or equal to about 10° C. and 70° C., preferably between or equal to about 25° C. and 60° C. The substrates requiring deposition are placed within the mixture for times ranging from several minutes to several hours. Silicon dioxide grows spontaneously upon the immersed substrates, and the total growth can be controlled by modulating concentration, temperature, deposition time, or a combination thereof. Layer thickness for the LPD films will be discussed subsequently.

The substrate is subjected to a dopant diffusion process (step 150). The dopant diffusion process involves elevating the temperature of the wafer and exposing it dopant precursor gases within an overall gas composition for a predetermined time. For production of an n-type doping region, a dopant atom may be phosphorous, which can be supplied by exposing the wafer to any suitable material containing phosphorous. This includes exposure to easily vaporizable phosphorous sources such as phosphine ($PH_3$) or phosphorous oxychloride ($POCl_3$). In some embodiments, the step may also involve applying a coating to the wafer prior to the high temperature step which contains phosphorous. Nonlimiting examples of coatings include so called spin on dopants, preferably dopants which contain $P_2O_5$ glasses in mixtures with silica and alumina based glasses. For production of a p-type doping region, a dopant atom may be boron, which can be supplied by exposing the wafer to any suitable material containing boron. This includes exposure to easily vaporizable boron sources such as boron tribromide ($BBr_3$). In some embodiments, the step may also involve applying a coating to the wafer prior to the high temperature step which contains boron. Nonlimiting examples of coatings include so called spin on dopants, preferably ones which contain borosilicate glasses in mixtures with silica and alumina based glasses.

A vaporized dopant diffusion includes the following steps: (a) an initial temperature ramp to raise the temperature of the wafer to diffusion temperatures; (b) a dopant vapor flow, in which the gas mixture flowing over the substrates includes the dopant source or dopant precursor, and optionally an oxygen and nitrogen gas background; (c) a drive-in comprising a further exposure to a background gas mixture of oxygen and nitrogen gas mixture, but without the presence of the dopant precursors; and (d) a step to cool down the wafer.

It has been found that certain diffusion conditions work best with the LPD produced barrier. In some embodiments, it is desirable to tune the thickness of the LPD layer to get the highest difference in substrate doping between areas that have the barrier and those that do not. While a thicker LPD layer can be utilized, it is preferable only utilize a thickness necessary to achieve to achieve the desired doping levels. Further, this allows the process to remain fast and relatively inexpensive. The parameters that can be measured is the total amount of dopant (in areas containing the barrier layer versus those areas that do not), or more easily the sheet resistance of the respective areas.

It has been found that the inclusion of a step exposing the wafer to a concentration of 1% (molar) oxygen or greater for 2 minutes or greater improves the performance of the LPD film as a barrier layer. This exposure step is performed after the initial temperature ramp, but prior to the dopant vapor flow. Not wishing to be bound by theory, it is believed that the inclusion of such step either reduces any porosity that exists in the as deposited LPD film, or provides appropriate chemical termination to and chemical moieties in the LPD films that were not previously reacted and converts them to stoichiometric $SiO_2$.

It has further been found that the time of dopant flow relative to the time of the drive in should be kept at a minimum to ensure the best operation of the LPD barrier layer. In some embodiments, the time of the dopant vapor flow can be equal to or between 2 minutes to 30 minutes, preferably equal to or between 10 minutes to 20 minutes. In some embodiments, the molar concentration of the dopant in the dopant vapor flow can be equal to or between 0.1 to 3%, preferably equal to or between 0.25 to 1%. In some embodiments, the ratio of the time of the dopant vapor flow to the time of the drive in is equal to or below 1:1, preferably equal to or below 1:1.5. Not wishing to be bound by theory, it is believed that longer dopant vapor flows convert the LPD $SiO_2$ to a phosphorous doped glass, which at the temperatures of the diffusion has poorer barrier properties.

Additionally, certain oxygen concentrations are desirable during the dopant vapor flow to ensure the best operation of the LPD barrier layer. In some embodiments, the molar oxygen concentration in the dopant vapor flow step can be equal to or between 0.5 to 3%, preferably equal to or between 0.7 to 2%.

After the doping process, layers present from prior process steps may be optionally removed (step 160). These layers may include the dopant glasses that are a byproduct of the diffusion process, including phosphosilicate glasses or borosilicate glasses. These layers may also include the LPD barrier layers that have been previously applied. The removal may be accomplished with any chemical bath that dissolves the desired layers. For example, a bath containing HF may be utilized to dissolve the layers.

Next, the substrate may optionally undergo additional processing steps to independently pattern additional doping regions (step 170). Alternatively, the substrate may go on to subsequent steps involved in standard solar cell construction such as, but not limited to, the application of the antireflection layer, application of metal contacts, assembly into photovoltaic modules, or the like. For selective emitter applications, the application of the contacts may be aligned with the LPD pattern created by the combination of steps 120 and 130. This alignment can be achieved with mechanical means referencing from edges and/or corners of the wafer, optical means referencing from edges and/or corners of the wafer, or fiducial marks that are applied on or before step 120, or a combination thereof.

Figure 1B:
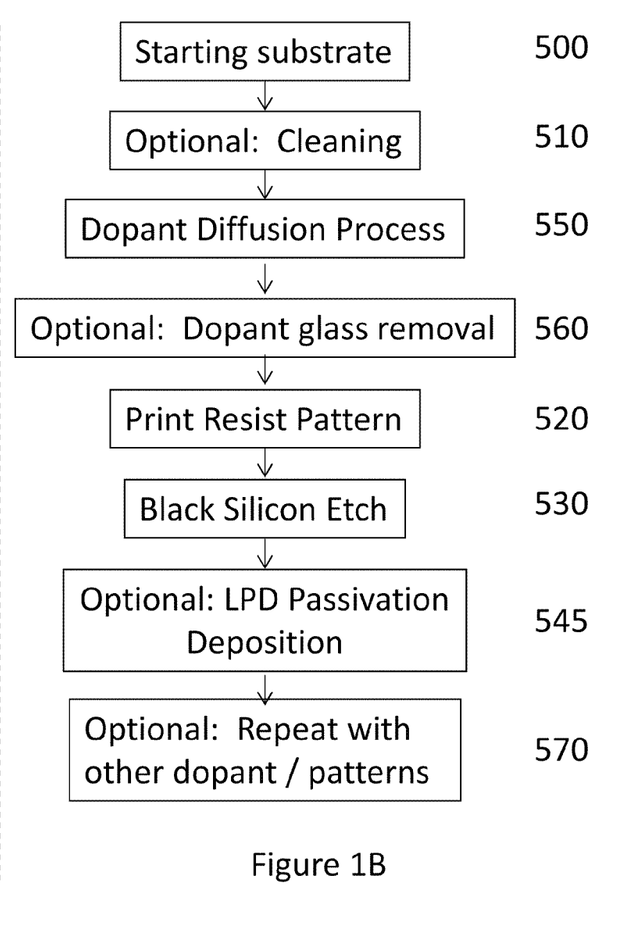
FIG. 1B is an illustrative embodiment of a flow diagram for the fabrication of a pre-nano emitter cell.

Fabrication of a pre-nano emitter cell has similar steps to fabricating a post-nano emitter cell. For the purposes of brevity, the similar steps discussed below do not repeat discussion of all the features of each step. However, it will be recognized that the similar steps discussed below may include all or some of the features of the steps discussed above. FIG. 1B is an illustrative embodiment of a flow diagram for the fabrication of a pre-nano emitter cell. The starting substrate 500 can receive optional cleaning step 510 as described above in step 110. The substrate then receives a dopant diffusion process 550 similar to process 150 which dopes the top layer of the substrate; however, an LPD material is not present during a dopant diffusion process 550. The dopant glass that forms on the substrate can be optionally removed 560 in a similar manner as described above in step 160. However, since a LPD material is not present, cleaning in step 560 does not require a solution capable of removing LPD material. The polymer resist is applied to the substrate in step 520 similar to step 120 above, and a nanoscale texture etch is performed in step 530 similar to step 130 above.

After the nanoscale texturization, but prior to removal of the polymer resist, it may be desirable to deposit additional layers that are also masked by the polymer resist pattern, and thus in automatic alignment with the nanoscale texture pattern. An LPD deposition (step 545) can be done for the purpose of passivating the nanostructure surface. For a pre-nano emitter cell, this can be particularly advantageous because the passivation layer will only exist on the porous structure and not interfere with the formation of electrical contact of the front metal grid to the cell.

Next, the substrate may optionally undergo additional processing steps to pattern additional doping regions 570. Alternatively, the substrate may go on to subsequent steps involved in standard solar cell construction such as, but not limited to, the application of the antireflection layer, application of metal contacts, assembly into photovoltaic modules, or the like. For selective emitter applications, the application of the contacts may be aligned with the resist pattern created by the combination of steps 520. This alignment can be achieved with mechanical means referencing from edges and/or corners of the wafer, optical means referencing from edges and/or corners of the wafer, or fiducial marks that are applied on or before step 520, or a combination thereof.

Figure 2A:
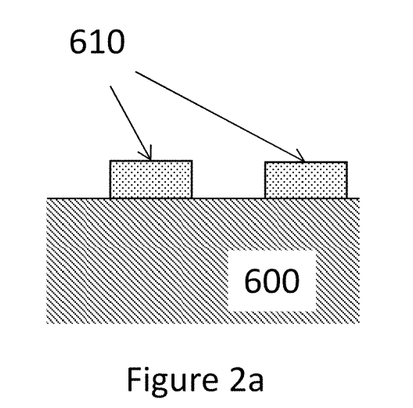
FIGS. 2A-2D are illustrative embodiments of a substrate with patterned nanoscale texture produced using a post-nano emitter method.
Figure 2B:
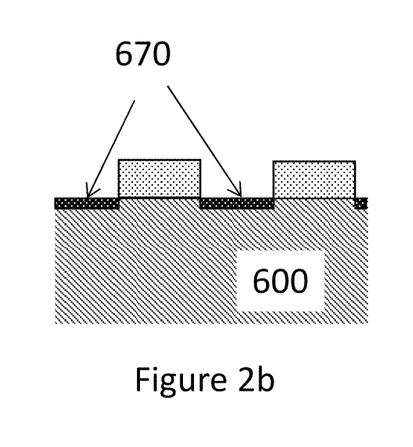
Figure 2C:
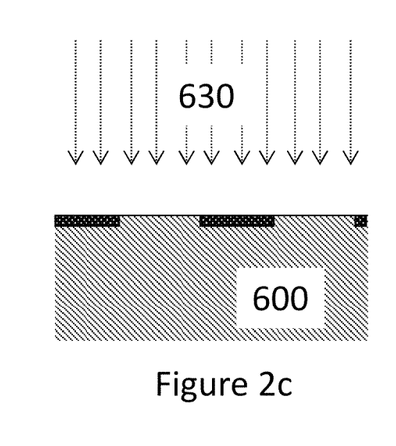
Figure 2D:
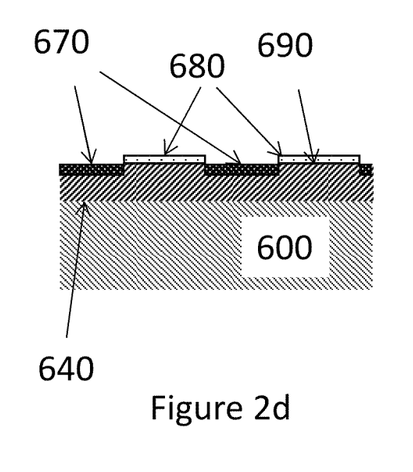

FIGS. 2A-2D are illustrative embodiments of a substrate with patterned nanoscale texture produced using a post-nano emitter method. A polymer resist pattern 610 is printed on to substrate 600 (FIG. 2A). The resulting substrate is immersed in a solution or series of solution capable of forming a nanoscale texture on the surface, resulting in a patterned nanoscale textured regions 670 in the areas absent of the polymer resist 610 (FIG. 2B). The polymer resist 610 is removed by appropriate treatment with a solvent or dry process and the substrate is subjected to a doping process 630 (FIG. 2C) which leads to doping region 640 which exists on both the nanoscale textured surface 670 and on the areas 690 without nanoscale texture. In subsequent steps, areas 690 without nanoscale texture may be aligned with the front metal grid contacts 680. Despite the fact that all areas have received a uniform doping treatment, it is likely that the areas with nanoscale texture will exhibit a higher resistivity due to their porous nature.

Figure 3A:
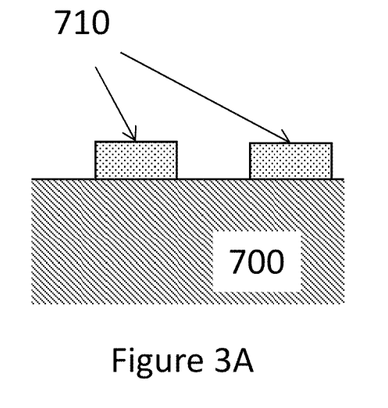
FIGS. 3A-3E are illustrative embodiments of a substrate with patterned nanoscale texture produced using a post-nano emitter method with selective emitter doping.
Figure 3B:
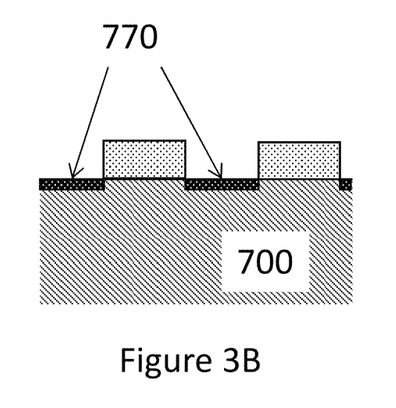
Figure 3C:
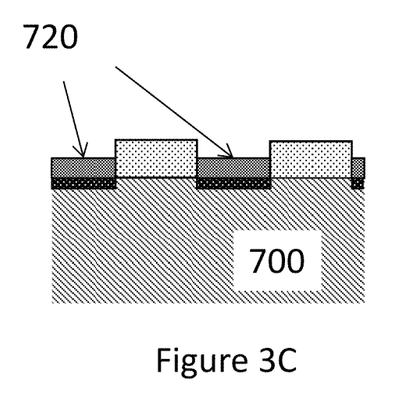
Figure 3D:
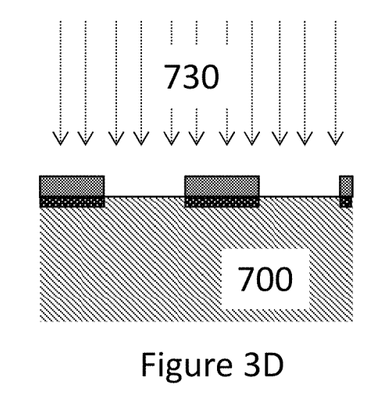
Figure 3E:
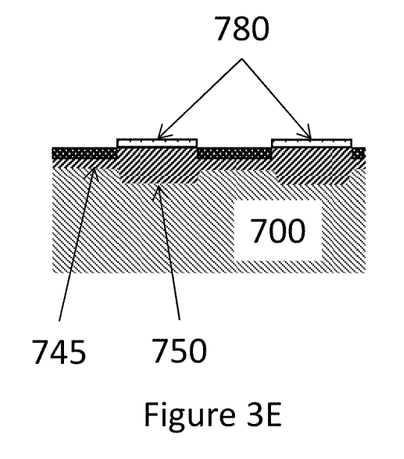

FIGS. 3A-3E are illustrative embodiments of a substrate with patterned nanoscale texture produced using a post-nano emitter method. An LPD film is applied over and in registration with the nanoscale texture to act as a diffusion barrier during subsequent doping, yielding a structure that is a nanoscale textured selective emitter cell with minimal processing. A polymer resist pattern 710 is printed on to substrate 700 (FIG. 3A). The resulting substrate is immersed in a solution or series of solution capable of forming a nanoscale texture on the surface, resulting in a patterned nanoscale textured regions 770 in the areas absent of the polymer resist 710 (FIG. 3B). The resulting substrate is immersed in an LPD deposition solution, resulting in a patterned LPD barrier layer 720 in the areas absent of the polymer resist 710 (FIG. 3B). The resulting LPD barrier layer 720 is automatically aligned, also termed self-aligned, to the underlying nanoscale textured regions 770. The LPD barrier layer 720 may be thin enough that during the doping process 730 diffusion of the dopant through the barrier will be impeded, but will still occur, thereby leading to some doping under the barrier. In some embodiments, an LPD barrier layer 720 that allows some doping to occur may be equal to or less than 100 nm thick. In other embodiments, an LPD barrier layer 720 that allows some doping to occur may be equal to or less than 50 nm thick, preferably equal to or less than 30 nm. The polymer resist 710 is removed by appropriate treatment with a solvent or dry process. The substrate is then subjected to a doping process 730 (FIG. 3D) which leads to surface doping layer regions 745 and 750 (FIG. 3E). Region 745 which sits under the LPD barrier layer is less deep than region 750 which is associated with no barrier layer. As a result, region 745 would have a higher resistivity than region 750, as is required for a selective emitter construction. For completion of a solar cell according to this embodiment, metal contacts 780 may be substantially aligned to the regions 750 containing the deeper doping and without nanoscale texturization. This can occur at any suitable point in the remaining process.

Figure 4A:
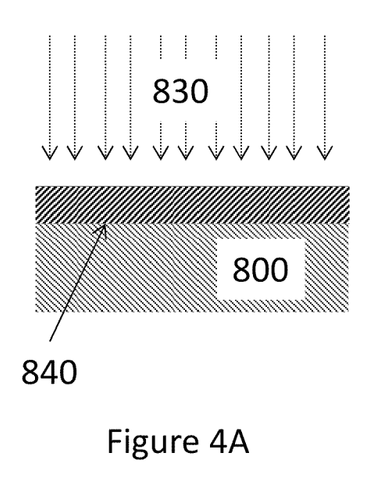
FIGS. 4A-4D are illustrative embodiments of a substrate with patterned nanoscale texture produced using a pre-nano emitter method.
Figure 4B:
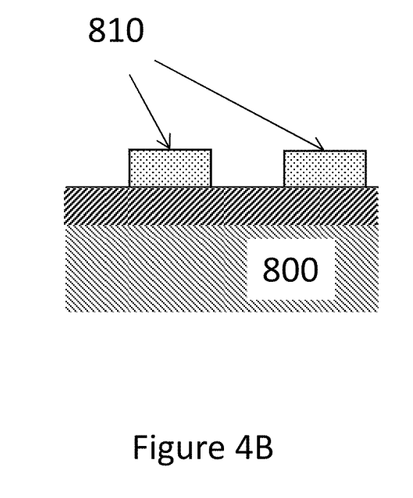
Figure 4C:
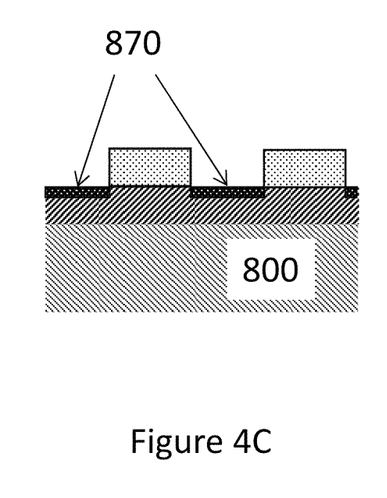
Figure 4D:
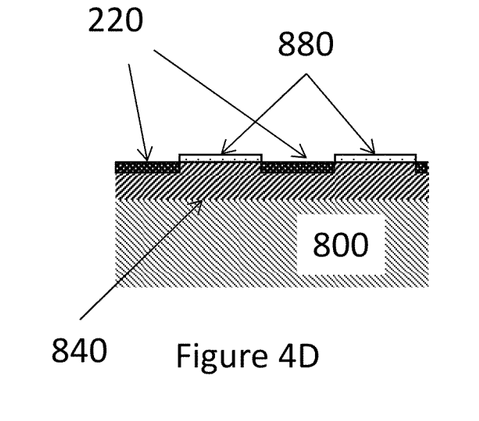

FIGS. 4A-4D are illustrative embodiments of a substrate with patterned nanoscale texture produced using a pre-nano emitter method. This embodiment has the added benefit of also forming an automatic selective emitter as will be described. Substrate 800 is subjected to a doping process 830 (FIG. 4A) which leads to a uniform doping region 840 at the surface of the substrate. A polymer resist pattern 810 is printed on to substrate 800 (FIG. 4B). The resulting substrate is immersed in a solution or series of solutions capable of forming a nanoscale texture on the surface, resulting in patterned nanoscale textured regions 870 in the areas absent of the polymer resist 810 (FIG. 4C). The polymer resist 810 is removed by appropriate treatment with a solvent or dry process to expose areas 890 without nanoscale texture. For completion of a solar cell according to this embodiment, metal contacts 880 may be substantially aligned to the regions 890 without nanoscale texture. This can occur at any suitable point in the remaining process.

During dopant diffusion the concentration of the dopant is highest near the surface of the substrate. In many cases this doping is high enough that it leads to the formation of a "dead zone" in which the doping is so high that charge carriers generated in that region suffer excessive recombination and do not contribute to the output of the cell, thereby reducing efficiency. In FIG. 4B the entire surface of substrate 800 is similarly doped, and in some cases, may provide a dead zone. In the pre-nano emitter cell of FIG. 4D, which shows substrate 800 after etching, the nanoscale texturing of selected regions removes some or all of the dead zone at the top of doping region 840, thereby producing a selective emitter in an etch back process simultaneously with providing increased light absorption through pattern nanoscale texturization. In other words, patterned nanoscale textured regions 870 exhibit a high resistivity than surface regions below the metal contacts 880.

EXPERIMENTAL EXAMPLE

The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

Example 1

This example demonstrates the capability to pattern black silicon etching. 125 mm×125 mm p-type silicon wafers with pyramidal surface texture are cleaned by dipping in 1:10 HF:Water for 10 minutes followed by extensive rinsing in deionized water.

A polymer resist ink is formulated by dissolving a polymer composed of approximately 88% vinylbutyral, 11% vinylalcohol, and 1% vinylacetate monomer units in butoxyethanol at 17 weight % polymer. A test pattern of polymer resist ink is screen printed on the wafers followed by baking at 70° C., producing areas on the wafers with and without coverage of the polymer.

A black etch solution is created by mixing stock solutions of HF, $H_2O_2$, and $AgNO_3$ in order to achieve final concentrations of 0.9 M HF, $3\times10^{-5}$ M $AgNO_3$, and 3.06 M $H_2O_2$. Wafers are immersed in this solution immediately after mixing for 110 seconds in order to produce a black surface in regions not protected by the polymer resist.

Example 2:

A patterned black silicon wafer is made as discussed above in example 1. After black silicon etching the sample is rinsed with deionized water.

An LPD stock solution is created by adding 70 g of high purity fumed silica per 1 liter of 35 wt % $H_2SiF_6$ aqueous solution. The mixture is stirred for 12 hours at room temperature, at which point excess silica is filtered out, yielding a saturated solution. 1100 g of the above solution and 3300 g of water are mixed and heated to 30° C., at which point the patterned substrate is immersed for 30 minutes. An LPD film forms only in areas of the substrate that are not covered with the polymer resist, and thus has automatically the same pattern as the black silicon. The LPD layers serve as a passivation layer for the black silicon and could also be used as a barrier layer to impeded dopant diffusion.

The two examples discussed above provided surface texturization of the silicon wafers with diffuse reflectance that were below 5% in the range of 400 to 1100 nm wavelengths.

Implementations described herein are included to demonstrate particular aspects of the present disclosure. It should be appreciated by those of skill in the art that the implementations described herein merely represent exemplary implementation of the disclosure. Those of ordinary skill in the art should, in light of the present disclosure, appreciate that many changes can be made in the specific implementations described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The implementations described hereinabove are meant to be illustrative only and should not be taken as limiting of the scope of the disclosure.

What is claimed is:

1. A method for producing a solar cell with a textured surface, the method comprising:
   depositing a resist on at least one first region of a surface of a semiconductor substrate, wherein the resist is not deposited on at least one etching region of the surface;
   etching the surface of the semiconductor substrate, wherein the at least one etching region of the surface is textured by said etching to reduce reflectivity, and the resist prevents etching in the at least one first region;
   applying a diffusion barrier layer utilizing liquid phase deposition (LPD), wherein the diffusion barrier layer is applied after the etching and before applying at least one contact, and the diffusion barrier layer is deposited on the at least one first region that was not etched and self-aligned with the at least one etching region;
   removing the resist;

doping the surface of the semiconductor substrate, wherein the doping causes the at least one etching region to have a higher resistivity than the at least one first region; and applying the at least one contact to the surface, wherein the at least one contact is deposited on the at least one first region.

2. The method of claim 1, wherein the resist is a polymeric material that is a copolymer that contains greater than or equal to 70 molar % poly(vinylbutyral) and greater than or equal to 5% poly(vinylalcohol).

3. The method of claim 1, wherein the at least one etching region of the surface is textured with nanoscale pores that are 0.05 to 1 micron deep and diameters of the nanoscale pores are equal to or below 250 nanometers.

4. The method of claim 1, further comprising removing the diffusion barrier layer and any dopant glass after doping and before applying the at least one contact.

5. The method of claim 1, wherein the diffusion barrier layer is equal to or less than 50 nm thick.

6. The method of claim 1, wherein the doping comprises the steps of an initial temperature ramp to a diffusion temperature; a dopant vapor flow exposing the semiconductor substrate to a dopant; a drive-in exposing the semiconductor substrate to an oxygen and nitrogen mixture; and a cool down step, and a ratio of the dopant vapor flow time to a drive in time is less than or equal to 1.

7. The method of claim 1, further comprising exposing the semiconductor substrate to oxygen before the doping of the surface.

8. The method of claim 7, wherein a molar oxygen concentration during the exposing to oxygen is equal to or between 0.5 to 3%, and the exposing is performed for 2 minutes or greater.

9. The method of claim 1, wherein the substrate is doped prior to deposition of said resists, and the etching results in the at least one etching region having a higher resistivity than the first region.

10. A method for producing a solar cell with a textured surface, the method comprising:

depositing a resist on a surface of a semiconductor substrate, wherein the resist is deposited on at least one first region and defines at least one etching region of the surface;

etching the surface of the semiconductor substrate after depositing the resist, wherein the etching causes multiple nanoscale structures to form in the at least one etching region of the surface, and the resist prevents etching in the at least one first region;

applying a diffusion barrier layer utilizing liquid phase deposition (LPD) after etching and before removing the resist, wherein the diffusion barrier layer is deposited on the at least one first region that was not etched and self-aligned with the at least one etching region;

removing the resist after the etching;

doping the surface of the semiconductor substrate, wherein the doping results in the at least one etching region having a higher resistivity than the at least one first region that was not etched; and applying at least one contact to the surface after doping, wherein the at least one contact is deposited on the at least one first region.

11. The method of claim 10, wherein the resist is a polymeric material that is a copolymer that contains greater than or equal to 70 molar % poly(vinylbutyral) and greater than or equal to 5% poly(vinylalcohol).

12. The method of claim 10, wherein multiple the nanoscale structures are nanoscale pores that are 0.05 to 1 micron deep and diameters of the nanopores are equal to or below 250 nanometers.

13. The method of claim 10, wherein the diffusion barrier layer is equal to or less than 50 nm thick.

* * * * *